United States Patent
Lee et al.

(10) Patent No.: US 8,735,295 B2
(45) Date of Patent: May 27, 2014

(54) METHOD OF MANUFACTURING DUAL DAMASCENE STRUCTURE

(75) Inventors: Chang-Hsiao Lee, Tainan (TW);
Hsin-Yu Chen, Nantou County (TW);
Yu-Tsung Lai, Taichung (TW);
Jiunn-Hsiung Liao, Tainan (TW);
Shih-Chun Tsai, Pingtung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 11 days.

(21) Appl. No.: 13/526,554

(22) Filed: Jun. 19, 2012

(65) Prior Publication Data

US 2013/0337650 A1   Dec. 19, 2013

(51) Int. Cl.
*H01L 21/311* (2006.01)

(52) U.S. Cl.
USPC ........... 438/702; 438/700; 438/723; 438/734; 438/736

(58) Field of Classification Search
None
See application file for complete search history.

(56) References Cited

U.S. PATENT DOCUMENTS

| | | | |
|---|---|---|---|
| 5,314,845 A | 5/1994 | Lee | |
| 5,362,526 A | 11/1994 | Wang | |
| 5,387,546 A | 2/1995 | Maeda | |
| 6,015,759 A | 1/2000 | Khan | |
| 6,037,237 A | 3/2000 | Park | |
| 6,074,946 A | 6/2000 | Ouellet | |
| 6,103,601 A | 8/2000 | Lee | |
| 6,153,530 A | 11/2000 | Ye | |
| 6,162,587 A | 12/2000 | Yang | |
| 6,380,096 B2 | 4/2002 | Hung | |
| 6,426,285 B1 | 7/2002 | Chen | |
| 6,465,352 B1 | 10/2002 | Aoki | |
| 6,573,176 B2 | 6/2003 | Hong | |
| 6,605,545 B2 | 8/2003 | Wang | |
| 6,638,871 B2 | 10/2003 | Wang | |
| 6,649,531 B2 | 11/2003 | Cote | |
| 6,696,222 B2 * | 2/2004 | Hsue et al. | 430/313 |
| 6,720,132 B2 | 4/2004 | Tsai | |
| 6,797,627 B1 | 9/2004 | Shih | |
| 6,812,145 B2 | 11/2004 | Ma | |
| 6,905,968 B2 | 6/2005 | Hsieh | |
| 6,924,228 B2 | 8/2005 | Kim | |
| 6,930,048 B1 | 8/2005 | Li | |
| 7,067,235 B2 | 6/2006 | Tsai | |
| 7,176,126 B2 | 2/2007 | Oh | |

(Continued)

OTHER PUBLICATIONS

Mi et al., Title: Manufacturing Method for Dual Damascene Structure, pending U.S. Appl. No. 13/150,145, filed Jun. 1, 2011.

(Continued)

*Primary Examiner* — Kyoung Lee
(74) *Attorney, Agent, or Firm* — Winston Hsu; Scott Margo

(57) ABSTRACT

A method for fabricating a dual damascene structure includes the following steps. At first, a dielectric layer, a dielectric mask layer and a metal mask layer are sequentially formed on a substrate. A plurality of trench openings is formed in the metal mask layer, and a part of the metal mask layer is exposed in the bottom of each of the trench openings. Subsequently, a plurality of via openings are formed in the dielectric mask layer, and a part of the dielectric mask layer is exposed in a bottom of each of the via openings. Furthermore, the trench openings and the via openings are transferred to the dielectric layer to form a plurality of dual damascene openings.

18 Claims, 7 Drawing Sheets

(56) References Cited

U.S. PATENT DOCUMENTS

| | | |
|---|---|---|
| 7,544,623 B2 | 6/2009 | Chou |
| 2002/0122366 A1* | 9/2002 | Kitaura et al. ............. 369/53.3 |
| 2003/0129844 A1 | 7/2003 | Wang |
| 2006/0024951 A1 | 2/2006 | Schuehrer |
| 2006/0042651 A1 | 3/2006 | Verhaverbeke |
| 2006/0148243 A1 | 7/2006 | Wang |
| 2006/0252256 A1 | 11/2006 | Weng |
| 2006/0286793 A1 | 12/2006 | Lin |
| 2007/0020565 A1 | 1/2007 | Koh |
| 2007/0052107 A1 | 3/2007 | Weng |
| 2007/0054491 A1 | 3/2007 | Chen |
| 2007/0066047 A1 | 3/2007 | Ye |
| 2007/0077751 A1 | 4/2007 | Chen |
| 2007/0080386 A1 | 4/2007 | Huang |
| 2007/0093053 A1 | 4/2007 | Hsu |
| 2007/0111514 A1 | 5/2007 | Chen |
| 2007/0184996 A1 | 8/2007 | Weng |
| 2007/0190805 A1 | 8/2007 | Lin |
| 2007/0249165 A1 | 10/2007 | Huang |
| 2008/0121619 A1 | 5/2008 | Lin |
| 2008/0124919 A1 | 5/2008 | Huang |
| 2008/0146036 A1 | 6/2008 | Lai |
| 2008/0171433 A1 | 7/2008 | Huang |
| 2008/0292798 A1 | 11/2008 | Huh |
| 2009/0042053 A1 | 2/2009 | Lin |
| 2009/0142931 A1 | 6/2009 | Wang |
| 2009/0176378 A1 | 7/2009 | Wang |
| 2009/0283310 A1 | 11/2009 | Chen |
| 2009/0283921 A1 | 11/2009 | Wang |
| 2009/0314743 A1 | 12/2009 | Ma |
| 2010/0040982 A1 | 2/2010 | Liu |
| 2010/0105205 A1 | 4/2010 | Lee |

OTHER PUBLICATIONS

Chen, U.S. Appl. No. 13/033,696, filed Feb. 24, 2011.

* cited by examiner

METHOD OF MANUFACTURING DUAL DAMASCENE STRUCTURE

BACKGROUND OF THE INVENTION

1. Field of the Invention

The present invention relates to a method of fabricating a dual damascene structure, and more particularly, to a method of fabricating a dual damascene structure adopting the double patterning technique (DPT).

2. Description of the Prior Art

In the fabrication of semiconductor integrated circuits (ICs), semiconductor devices are generally connected by several metallic interconnecting layers commonly referred to as multi-level interconnects, and a damascene process is a convenient and predominant method for forming the multi-level interconnects. Principally, the damascene process includes etching a dielectric material layer to form a trench and/or via patterns, filling the patterns with conductive materials, such as copper, and performing a planarization process. This way, a metal interconnect is obtained.

With the continuous miniaturization of the semiconductor devices and the remarkable advance in fabrication techniques of semiconductor devices, the double patterning technique (DPT) has been developed and taken as one of the most promising lithographic technologies for 32 nanometer (nm) node and 22 nm node patterning processes to overcome the limitations of the conventional tools. The litho-etch-litho-etch (LELE) approach, also called 2P2E, is one of the most common DPTs for fabricating patterns in a semiconductor device. For example, when a 2P2E approach is carried out, the first pattern can be formed in the target layer, such as a dielectric material layer, through the first lithography process, and subsequently, the second lithography process is performed to form the second pattern in the target layer. Accordingly, complicate and intensive patterns are defined in the specific region of the target layer.

However, after the first lithography process, the target layer having the first pattern formed thereon may directly contact the cleaning solution, the etchant or the chemical solvent used in the second lithography process, and the formed first pattern in the target layer may be deformed or the exposed surface of the target layer may be damaged, which may reduce the correctness of the formed first pattern and adversely affect the later manufacturing processes. For example, in the damascene process of the metal interconnect, the openings of the first pattern may not be capable of being filled with the conductive material and voids may be formed between the conductive material and the target layer due to the deformation of the first pattern, and the yield of the later formed semiconductor devices decreases.

Consequently, how to improve the patterning process for obtaining complete patterns is still an important issue in the field.

SUMMARY OF THE INVENTION

An objective of the present invention is therefore to provide a method of fabricating a dual damascene structure adopting the double patterning technique (DPT) to improve the completeness of the dual damascene structure.

According to one exemplary embodiment of the present invention, a method of fabricating a dual damascene structure includes the following steps. At first, a dielectric layer, a dielectric mask layer and a metal mask layer are sequentially formed on a substrate. A plurality of trench openings is formed in the metal mask layer, and a part of the metal mask layer is exposed in a bottom of each of the trench openings. Subsequently, a plurality of via openings are formed in the dielectric mask layer, and a part of the dielectric mask layer is exposed in a bottom of each of the via openings. Furthermore, the trench openings and the via openings are transferred to the dielectric layer to form a plurality of dual damascene openings.

As DPT is implemented in the present invention to form the trench openings and the via openings by respectively performing at least four patterning processes, the dielectric layer is totally covered by the dielectric mask layer to prevent the dielectric layer from being affected by the four patterning processes, for example, the dielectric layer may not absorb the etchants used in the patterning processes, this way the material characteristics of the dielectric layer can be maintained. Additionally, in the present invention, after the trench openings and the via openings are sequentially formed in the mask layers, the trench openings and the via openings in the mask layers are simultaneously transferred to the dielectric layer to avoid the effects caused by the etchants or the photoresist of the repeated patterning processes. Accordingly, precise patterns can be obtained, and the consistency of the dual damascene structure may be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
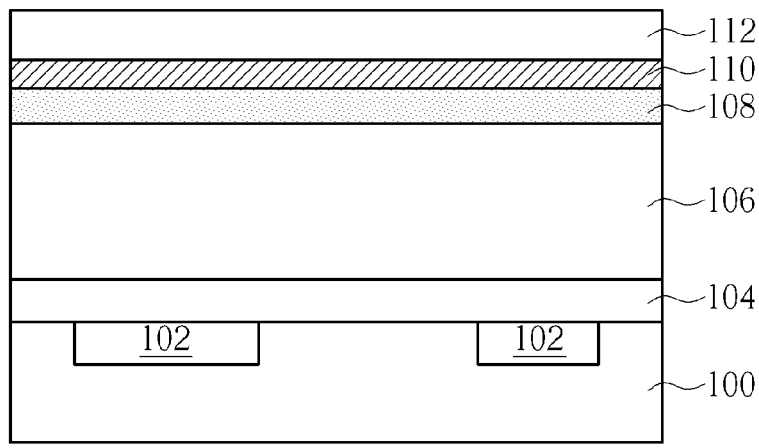
FIG. 1 through FIG. 14 are schematic diagrams illustrating a method of fabricating a dual damascene structure according to a preferred exemplary embodiment of the present invention.

The present invention provides a method of fabricating a dual damascene structure. Please refer to FIG. 1 through FIG. 14, which are schematic diagrams illustrating a method of fabricating a dual damascene structure according to a preferred exemplary embodiment of the present invention. As shown in FIG. 1, a substrate 100 is provided, and the substrate 100 includes a plurality of conductive layers 102 and a base layer 104 covering the conductive layers 102. The substrate 100 may include other semiconductor elements (not shown). The conductive layers 102 could be any kind of conductive elements, including gate electrodes, source electrodes, contact plugs, via plugs, conductive lines etc., or metal contacts. Furthermore, the base layer 104 could be made of dielectric material, for example, the base layer 104 may be a nitrogen doped silicon carbide (NDC) layer, but not limited thereto. Subsequently, a dielectric layer 106, a dielectric mask layer 108 and a metal mask layer 110 are sequentially formed on the substrate 100. A material of the dielectric layer 106 may include low dielectric constant (low-K) material (K value smaller than 3.9), ultra low-K (ULK) material (K value smaller than 2.6), or porous ULK material. Additionally, the etching resistance of the common photoresist layer is lower than the etching resistance of the dielectric mask layer 108 or the etching resistance of the metal mask layer 110, accordingly, the present invention uses the dielectric mask layer 108 or the metal mask layer 110 as a hard mask to replace the soft mask including photoresist layer to avoid the damage of the mask during the many patterning processes, and to assist to define the patterns having a small line width, such as the patterns having a line width of 32 nanometer (nm), 22 nm or below, through double patterning technique (DPT). The etching resistance of the dielectric mask layer 108 is lower than the etching resistance of the metal mask layer 110. Moreover, a cap layer 112 can be selectively formed on the metal mask layer 110, the cap layer 112 may include a single layered structure made of silicon oxynitride (SiON), silicon oxide (SiO), or tetraethylorthosilicate (TEOS), or a multi-layered structure made of silicon oxynitride and silicon oxide, or other composition. For example, a multi-layered structure has an upper layer made of silicon oxynitride and a bottom layer made of silicon oxide. In this exemplary embodiment, a thickness of the cap layer 112 is substantially around 300 angstrom (Å).

Figure 2:
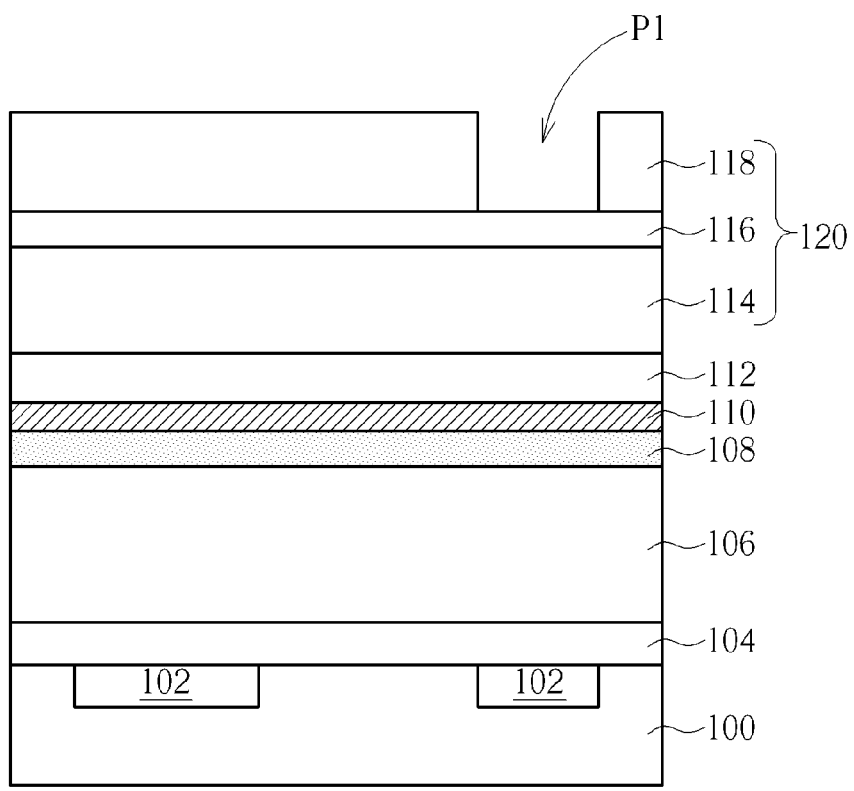
Figure 3:
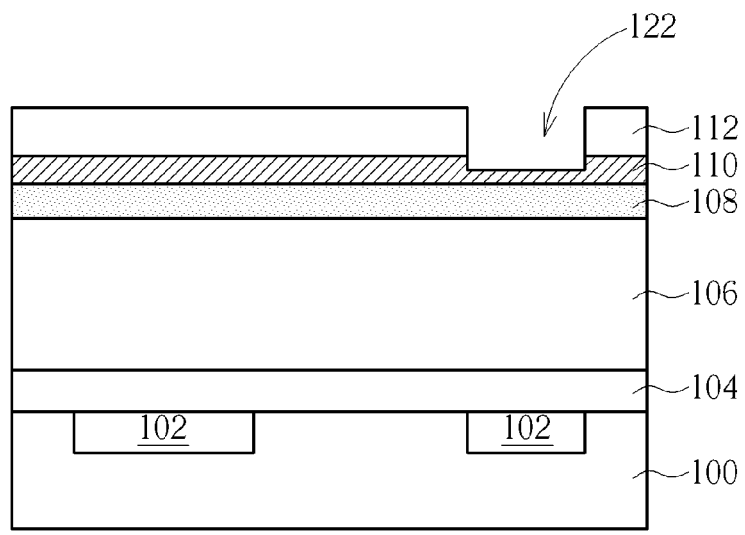

As shown in FIG. 2 and FIG. 3, a first patterned photoresist layer 120 is formed on the metal mask layer 110, the first patterned photoresist layer 120 preferably includes the pattern P1 that defines first trench openings, and the methods for forming the first patterned photoresist layer 120 are known to those skilled in the art, so the details are omitted herein for brevity. Subsequently, a first etching process is performed to form at least a first trench opening 122 in the metal mask layer 110. It is appreciated that, a part of the metal mask layer 110 is exposed in a bottom of the first trench opening 122, i.e. the first trench opening 122 does not penetrate through the metal mask layer 110, and the dielectric mask layer 108 is not exposed in the bottom of the first trench opening 122.

According to the process conditions and the manufacturing methods, the metal mask layer 110 may include a single layered structure or a multi-layered structure made of at least two materials. When the metal mask layer 110 is a single layered mask such as titanium nitride (TiN) layer, the thickness of the removed metal mask layer 110 can be modulated by a time mode, for example, by adjusting the process conditions such as the processing time of the first etching process, in order to keep a part of the metal mask layer 110 in the bottom of the first trench opening 122. Furthermore, when the metal mask layer 110 is a multi-layered structure made of at least an upper material layer (not shown) and at least a lower material layer (not shown), for example, a multi-layered structure made of a titanium (Ti) layer and a titanium nitride layer, an etchant having etching selectivity between the upper material layer and the lower material layer such as chlorine (Cl$_2$) could be selected to remove the upper material layer of the metal mask layer 110 and keep the lower material layer of the metal mask layer 110 in the bottom of the first trench opening 122, i.e. the lower material layer can serve as an etching stop layer in the first etching process, and the first trench opening 122 is only formed in the upper material layer. In this exemplary embodiment, the original thickness of the metal mask layer 110 is substantially around 150 Å, and a thickness of the metal mask layer 110 exposed in the bottom of the first trench opening 122 is substantially between 10 Å and 20 Å. Afterwards, the first patterned photoresist layer 120 is removed.

Figure 4:
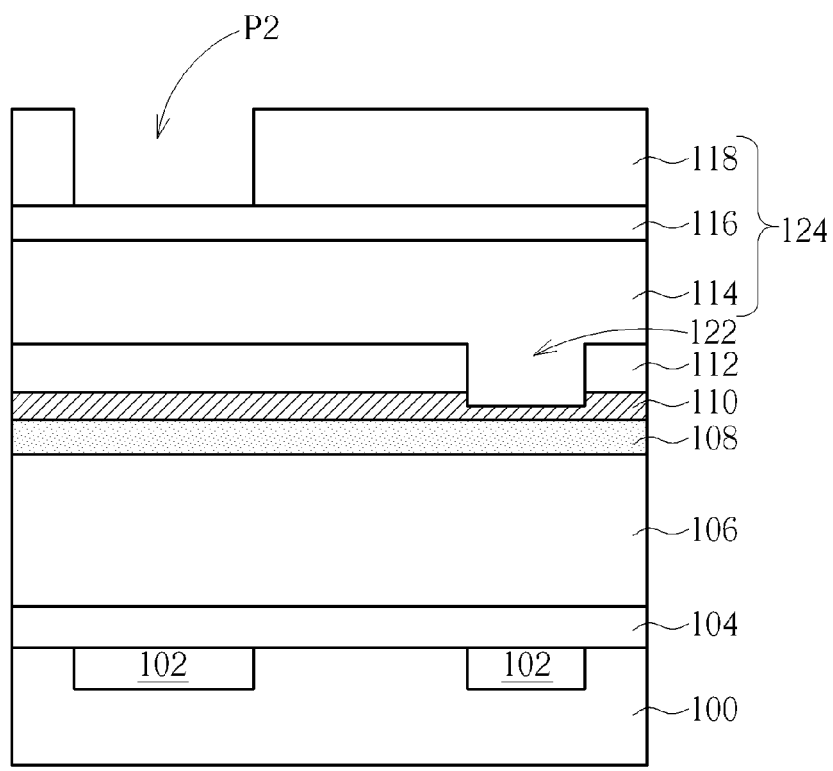
Figure 5:
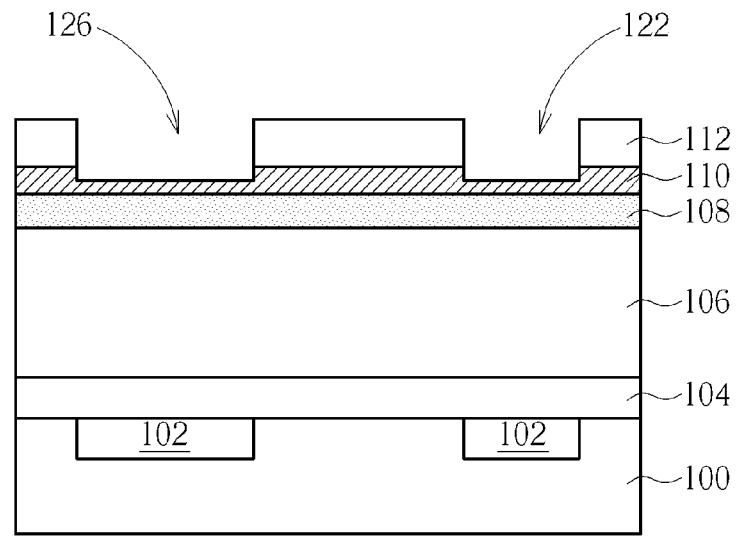

Similarly, as shown in FIG. 4 and FIG. 5, a second patterned photoresist layer 124 is formed on the metal mask layer 110 and in the first trench opening 122, the second patterned photoresist layer 124 preferably includes the pattern P2 to define second trench openings, and the methods for forming the second patterned photoresist layer 124 are known to those skilled in the art, so the details are omitted herein for brevity. Subsequently, a second etching process is performed to form at least a second trench opening 126 in the metal mask layer 110. It is appreciated that, a part of the metal mask layer 110 is exposed in a bottom of the second trench opening 126, i.e. the second trench opening 126 does not penetrate through the metal mask layer 110, and the dielectric mask layer 108 is not exposed in the bottom of the second trench opening 126. It is also appreciated that the first trench opening 122 formed in the first etching process does not penetrate through the metal mask layer 110, the second patterned photoresist layer 124 would therefore not directly contact the dielectric mask layer 108; and the dielectric layer 106 under the dielectric mask layer 108 can be prevented from directly contacting the cleaning solution, the etchant or the chemical solvent used in the lithography process of the second etching process so as to avoid deformation or damages of the dielectric layer 106.

Accordingly, the DPT process used to form the trench openings is now completed, i.e. a plurality of trench openings including the first trench opening 122 and the second trench opening 126 have been sequentially formed in the metal mask layer 110. In this exemplary embodiment, the first trench opening 122 and the second trench opening 126 are alternately disposed, and an interval between the first trench opening 122 and the second trench opening 126 is smaller than the exposure limit of the corresponding lithography process, i.e. the smallest distance between the patterns that could be resolved through exposure process and development process, but not limited thereto. Additionally, both of the first trench opening 122 and the second trench opening 126 do not penetrate through the metal mask layer 110, and a part of the metal mask layer 110 is therefore exposed in the bottom of each of the formed trench openings including the bottom of the first trench opening 122 and the bottom of the second trench opening 126, so that, before the later formation of via openings, the dielectric mask layer 108 would not be exposed by the trench openings, and the metal mask layer 110 exposed in the bottom of each of the trench openings (or the lower material layer serving as an etching stop layer) has a fixed thickness, which is beneficial for the consistency of the later formed dual damascene structures.

In the present invention, the patterned photoresist layer 120/124 used for forming the trench openings in the metal mask layer 110 can be selected from all kinds of photoresist materials or a combination thereof, and the material of the first patterned photoresist layer 120 and the material of the second patterned photoresist layer 124 could be the same or different. In the following paragraph, the patterned photoresist layer is illustrated, and the contents are also applicable for the later illustrated patterned photoresist layer 128/132. The first patterned photoresist layer 120 is taken for example; the first patterned photoresist layer 120 may include a tri-layered stack structure or a four-layered stack structure. In this exemplary embodiment, the first patterned photoresist layer 120 is a tri-layered stack structure including an anti-etching layer 114, an anti-reflective layer 116 and a photoresist (PR) layer 118. The anti-etching layer 114 is mainly made of 365 nm I-line PR or novolac resin. The anti-reflective layer 116 includes a silicon-containing hard mask (SHB) layer mainly made of organo-silicon polymers or polysilane including at least a chromophore group and a crosslinkable group, and a cross-linking agent may be further included in the anti-reflective layer 116, therefore, after the exposure process, a cross-link reaction is induced in the SHB layer. Furthermore, the PR layer 118 could be made of 193 nm or 248 nm deep ultraviolet (DUV) photoresist such as KrF photoresist.

In other exemplary embodiments, the first patterned photoresist layer 120 could be a four-layered stack structure including an advanced patterning film (APF) such as amorphous carbon layer, a dielectric anti-reflective coating film (DARC), a bottom anti-reflective coating film (BARC) and a photoresist layer sequentially from bottom to top. The APF has a high aspect ratio (HAR), low line edge roughness (LER) and PR-like ashability, so that it is widely used in semiconductor processes with line width smaller than 60 nm.

Figure 6:
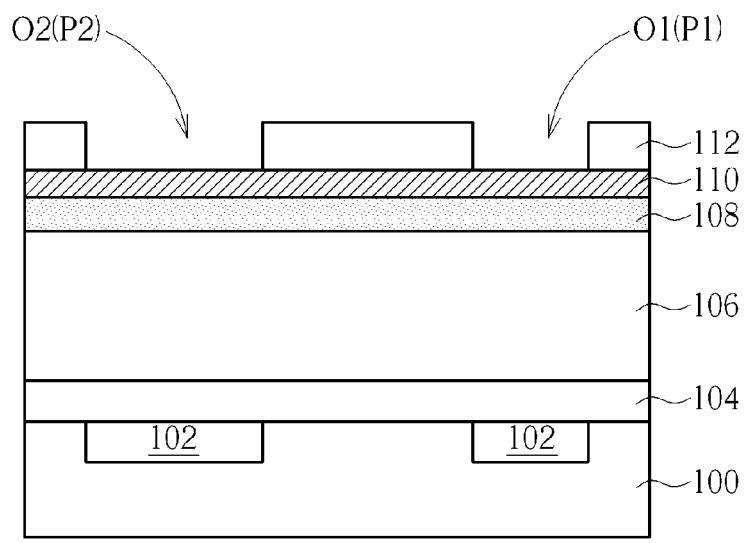

The step of forming the trench openings is not limited to sequentially forming the first trench opening 122 and the second trench opening 126 in the metal mask layer 110. As shown in FIG. 6, the method of forming trench openings may also include the following steps. At first, the pattern P1 that defines the first trench openings of the first patterned photoresist layer 120 and the pattern P2 that defines the second trench openings of the second patterned photoresist layer 124 are transferred to the cap layer 112 on the metal mask layer 110, i.e. at least a first opening O1 and at least a second opening O2 are sequentially formed in the cap layer 112. Subsequently, the cap layer 112 is used as the mask, and an etching process is performed to remove a part of the metal mask layer 110, and the first opening O1 and the second opening O2 are further transferred to the metal mask layer 100 for simultaneously forming at least a first trench opening 122 and at least a second trench opening 126 as shown in FIG. 5.

Figure 7:
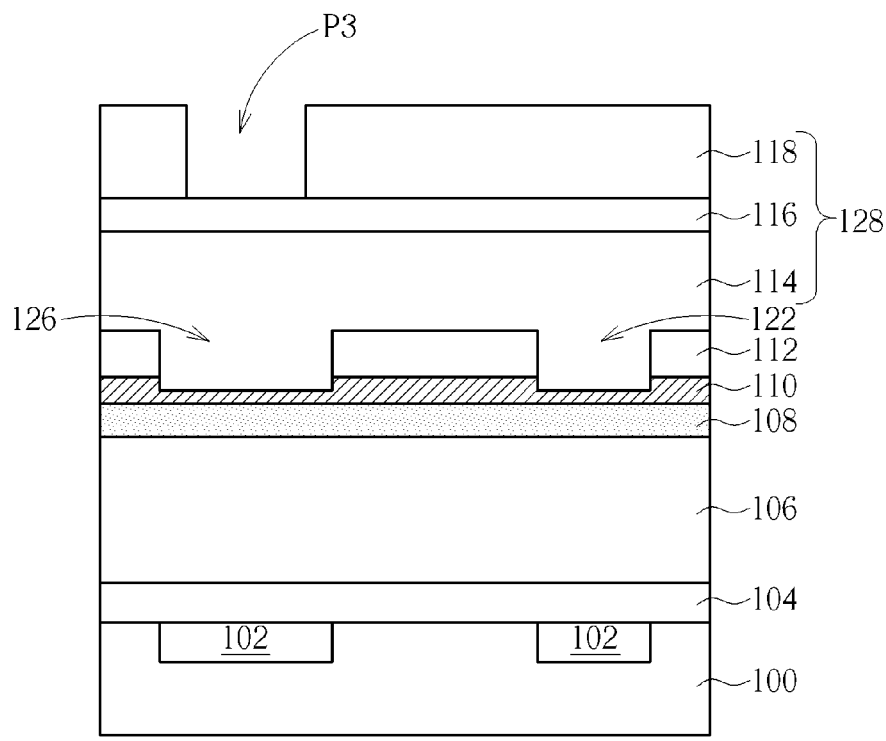
Figure 8:
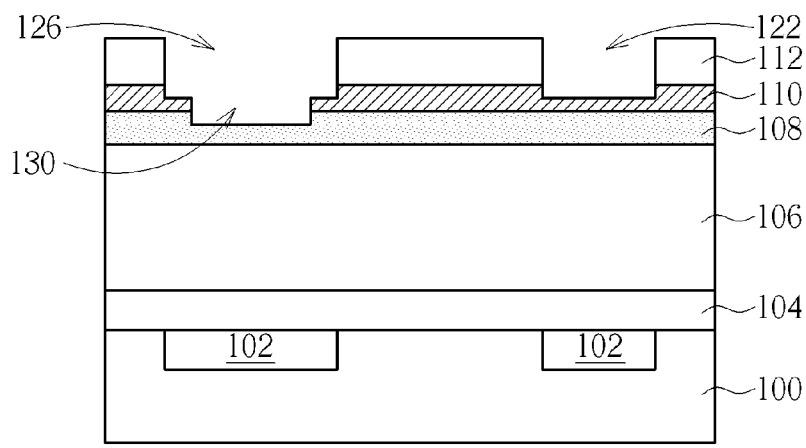

After the formation of the trench openings, as shown in FIG. 7 and FIG. 8, at first, a third patterned photoresist layer 128 is formed on the dielectric mask layer 108, and the third patterned photoresist layer 128 preferably includes the pattern P3 to define first via openings. The metal mask layer 110 exposed in the bottom of the first trench opening 122 and the second trench opening 126 (or the lower material layer serving as an etching stop layer) is between the third patterned photoresist layer 128 and the dielectric mask layer 108, so that the third patterned photoresist layer 128 does not directly contact the dielectric mask layer 108. The methods for forming third patterned photoresist layer 128 are known to those skilled in the art, so the details are omitted herein for brevity. Subsequently, a third etching process is performed to form at least a first via opening 130 in the dielectric mask layer 108. It is appreciated that, a part of the dielectric mask layer 108 is exposed in a bottom of the first via opening 130, i.e. the first via opening 130 does not penetrate through the dielectric mask layer 108, and the dielectric layer 106 is not exposed in the bottom of the first via opening 130. Furthermore, the first via opening 130 is in one of the trench openings (the first trench opening 122 and the second trench opening 126), but not limited thereto.

The dielectric mask layer 108 includes a single layered structure or a multi-layered structure made of at least an upper material layer and at least a lower material layer, and a material of the dielectric mask layer 108 could be made of silicon oxynitride, silicon oxide or other proper dielectric materials. When the dielectric mask layer 108 is a single layered mask such as silicon oxynitride (SiON) layer, the thickness of the removed dielectric mask layer 108 can be modulated by a time mode, for example, by adjusting the process conditions such as the processing time of the third etching process, in order to keep a part of the dielectric mask layer 108 in the bottom of the first via opening 130. Furthermore, when the dielectric mask layer 108 is a multi-layered structure made of at least an upper material layer (not shown) and at least a lower material layer (not shown), for example, as a multi-layered structure includes an upper material layer made of a silicon oxynitride (SiON) and a lower material layer made of a silicon nitride (SiN), an etchant having etching selectivity between the upper material layer and the lower material layer such as chlorine ($Cl_2$) could be selected to remove the upper material layer of the dielectric mask layer 108 and keep the lower material layer of the dielectric mask layer 108 exposed in the bottom of the first via opening 130, i.e. the lower material layer can serve as an etching stop layer in the third etching process, and the first via opening 130 is only formed in the upper material layer. In this exemplary embodiment, the original thickness of the dielectric mask layer 108 is substantially around 200 Å, and a thickness of the dielectric mask layer 108 exposed in the bottom of the first via opening 130 is substantially between 10 Å and 20 Å. Afterwards, the third patterned photoresist layer 128 is removed.

Figure 9:
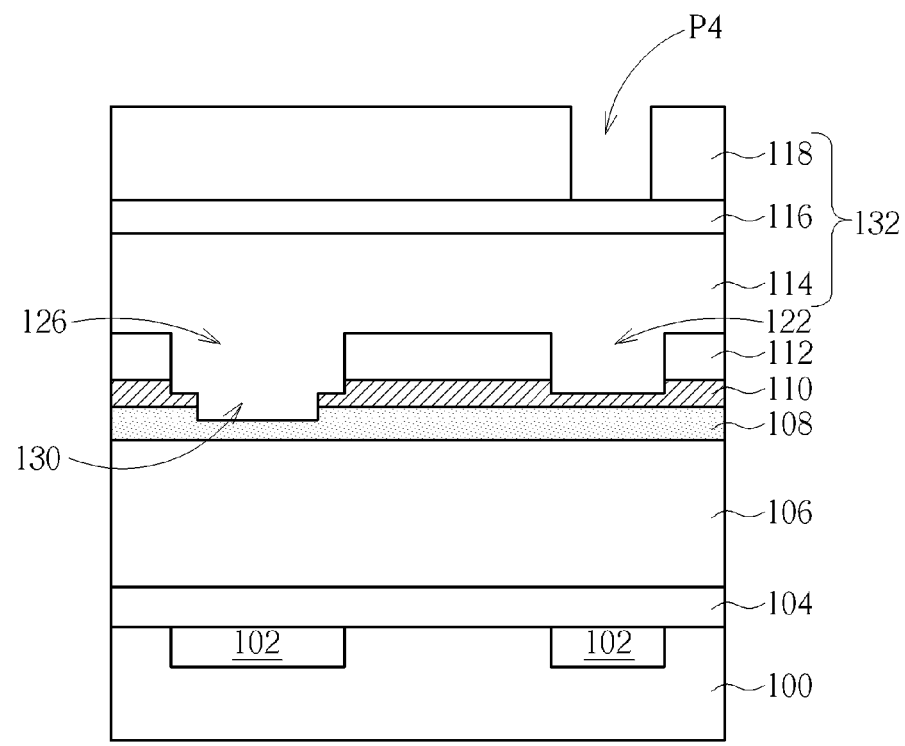
Figure 10:
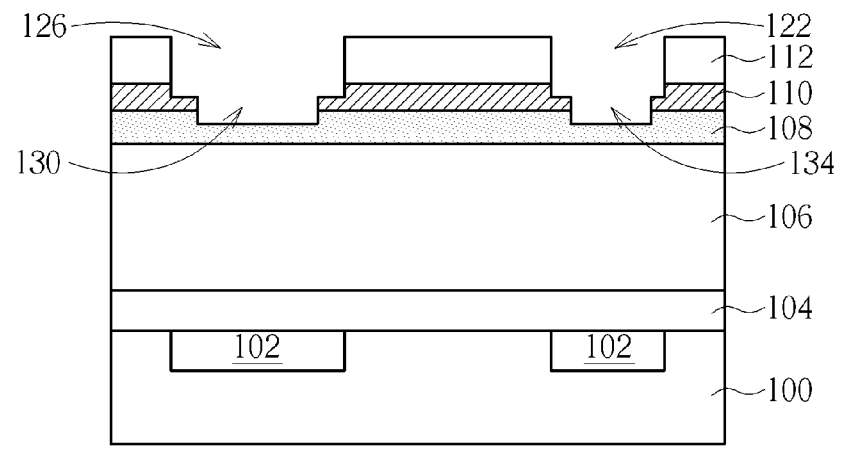

Similarly, as shown in FIG. 9 and FIG. 10, a fourth patterned photoresist layer 132 is formed on the dielectric mask layer 108 and in the first via opening 130, the fourth patterned photoresist layer 132 preferably includes the pattern P4 that defines second trench openings, and the fourth patterned photoresist layer 132 does not contact the dielectric layer 106. The methods for forming the fourth patterned photoresist layer 132 are known to those skilled in the art, so the details are omitted herein for brevity. Subsequently, a fourth etching process is carried out to form at least a second via opening 134 in the dielectric mask layer 108. It is appreciated that, in the fourth etching process, the second via opening 134 does not penetrate through the dielectric mask layer 108, and a part of the dielectric mask layer 108 is still exposed in a bottom of the second via opening 134, i.e. the dielectric layer 106 is not exposed in the bottom of the second via opening 134. More specifically, the dielectric layer 106 is not exposed by the trench openings (the first trench opening 122 and the second trench opening 126) and the via openings (the first via opening 130 and the second via opening 134), accordingly, the dielectric layer 106 could be not affected by the illustrated etching processes (the first etching process, the second etching process, the third etching process and the fourth etching process). Additionally, the second via opening 134 is in one of the trench openings, but not limited thereto. Afterwards, the fourth patterned photoresist layer 132 is removed.

Accordingly, the DPT process used for forming the via openings is now completed, i.e. a plurality of via openings including the first via opening 130 and the second via opening 134 have been sequentially formed in the dielectric mask layer 108. In this exemplary embodiment, the first via opening 130 and the second via opening 134 are alternately disposed, and an interval between the first via opening 130 and the second via opening 134 could be smaller than the exposure limit of the corresponding lithography process, i.e. the smallest distance between the patterns which could be resolved through exposure process and development process, but not limited thereto. Additionally, both of the first via opening 130 and the second via opening 134 do not penetrate through the dielectric mask layer 108, therefore, a part of the dielectric mask layer 108 is exposed in the bottom of each of the formed via openings including the bottom of the first via opening 130 and the bottom of the second via opening 134, so that before transferring the trench openings and the via openings to the dielectric layer 106, the dielectric layer 106 would not be exposed by the trench openings and the via openings. Furthermore, the dielectric mask layer 108 exposed in the bottom of each of the via openings (or the lower material layer serving as an etching stop layer) has a fixed thickness, which is beneficial for the consistency of the later formed dual damascene structures.

Figure 11:
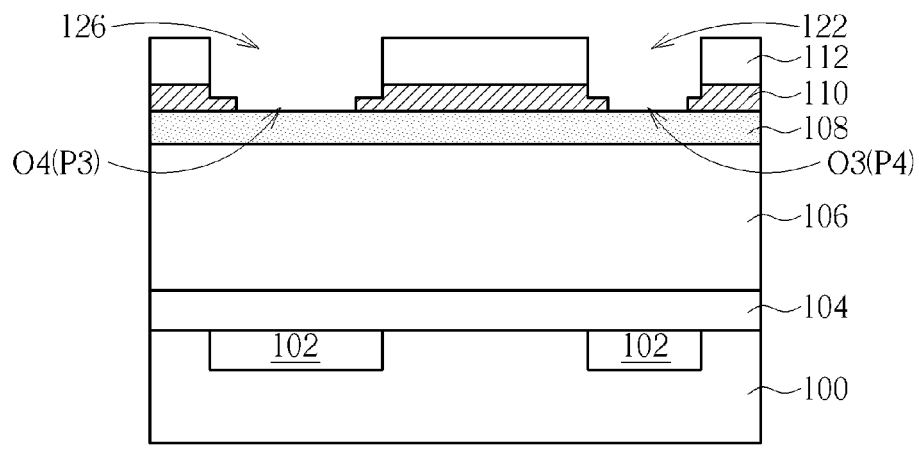

The step of forming via openings is not limited to sequentially forming the first via opening 130 and the second via opening 134 in the dielectric mask layer 108. As shown in FIG. 11, the method of forming via openings may also include the following steps. At first, the pattern P3 that defines the first via openings of the third patterned photoresist layer 128 and the pattern P4 that defines the second via openings of the fourth patterned photoresist layer 132 are transferred to the metal mask layer 110, for example, the dielectric mask layer 108 may serve as an etching stop layer, and an etching process is performed to partially remove the metal mask layer 110 exposed in the bottom of the first trench opening 122 to form at least a third opening O3 in the metal mask layer 110, and partially remove the metal mask layer 110 exposed in the bottom of the trench opening 126 to form at least a fourth opening O4 in the metal mask layer 110. In this exemplary embodiment, the metal mask layer 110 exposed in the bottoms of the first trench opening 122 and the second trench opening 126 are totally removed, therefore, the dielectric mask layer 108 could be exposed by the third opening O3 and the fourth opening O4, but not limited thereto, a part of the metal mask layer 110 could be still exposed in the bottoms of the third opening O3 and the fourth opening O4. Subsequently, the metal mask layer 110 serves as a mask, and an etching process is performed to remove a part of the dielectric mask layer 108 to transfer the third opening O3 and the fourth opening O4 to the dielectric mask layer 108 to simultaneously form at least a first via opening 130 and at least a second via opening 134 as shown in FIG. 10. In another exemplary embodiment, the dielectric mask layer 108 could be not removed, and the third opening O3 and the fourth opening O4 directly serve as the via openings. This way the trench openings and the via openings are formed in the metal mask layer 110.

Figure 12:
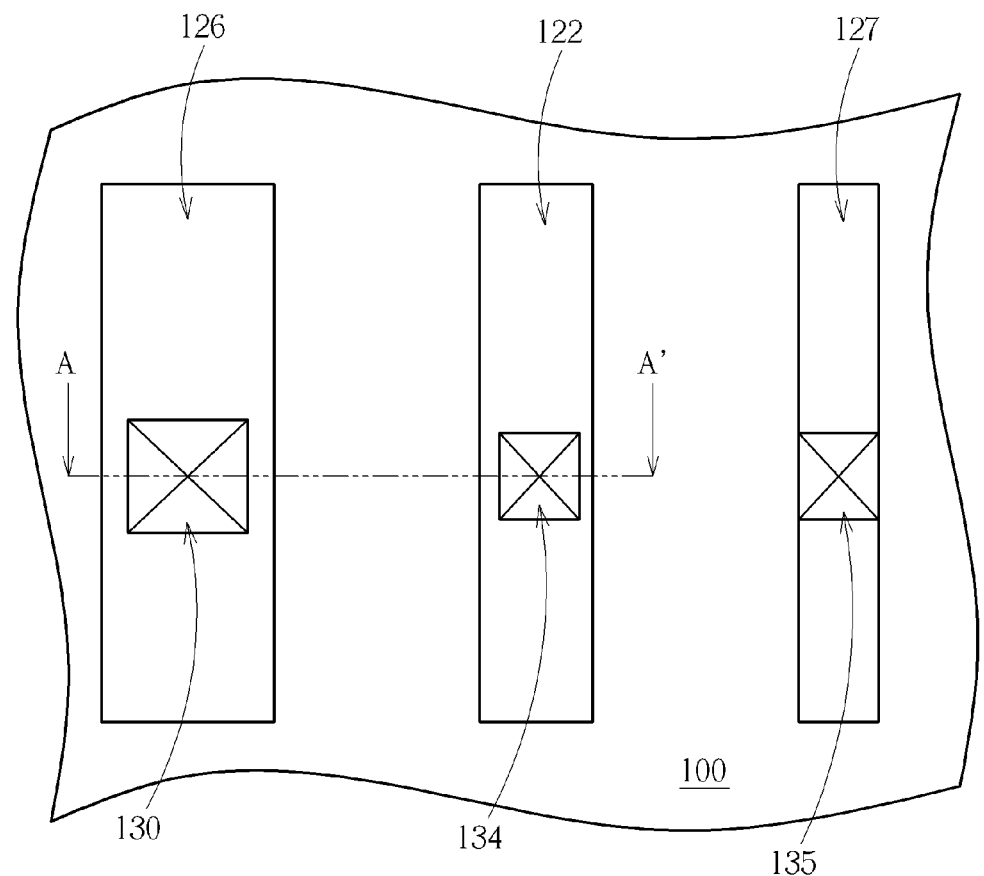

Please refer to FIG. 12, FIG. 12 is a schematic diagram illustrating a layout of the trench openings and the via openings. FIG. 12 is a top-view diagram, and FIG. 10 is a cross-section taken along the line A-A' in FIG. 12. Generally, each of the via openings totally or partially overlaps with the corresponding trench opening. As shown in FIG. 12, in this exemplary embodiment, the first via opening 130 is in the corresponding second trench opening 126, and the second via opening 134 is in the corresponding first trench opening 122. A width of the first via opening 130 is substantially smaller than a width of the second trench opening 126, and a width of the second via opening 134 is substantially smaller than a width of first trench opening 122, but not limited to. In other exemplary embodiment, the metal mask layer 110 exposed in the bottom of the trench opening 127 and a part of the dielectric mask layer 108 could be removed, and a width of the trench opening 127 is substantially the same as a width of the via opening 135 as shown in FIG. 12.

Figure 13:
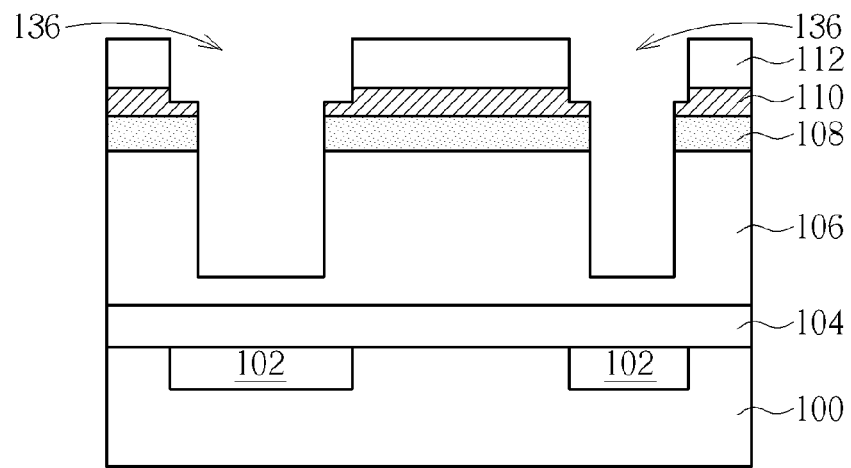

As shown in FIG. 13, a fifth etching process is subsequently performed with a first carbon and fluorine containing etchant having a high ratio of carbon atoms to fluorine atoms (hereinafter abbreviated as C/F ratio). The first carbon and fluorine containing etchant can include material selected from the group consisting of hexafluorobutadiene, octafluorocyclobutane, and perfluorocyclopentene. The fifth etching process is performed to etch the dielectric mask layer 108 exposed in the bottoms of the first via opening 130 and the second via opening 134, and a part of the dielectric layer 106. Thus a plurality of partial vias 136 is formed in the dielectric layer 106. It is appreciated that, since an etching rate to TiN and SiON (that are materials of the metal mask layer 110 and the dielectric mask layer 108) of the first carbon and fluorine containing etchant, which possesses a high C/F ratio, is much lower than its etching rate to the low-K material (that is a material of the dielectric layer 106). Accordingly, the dielectric layer 106 covered by the metal mask layer 110 and the dielectric mask layer 108 are protected from the first carbon and fluorine containing etchant during the fifth etching process without being removed.

Figure 14:
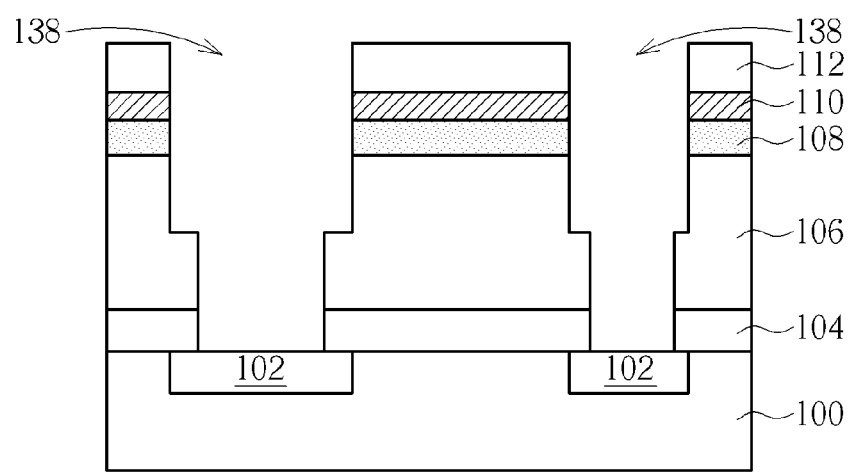

As shown in FIG. 14, after forming the partial vias 136, a sixth etching process is performed with a second carbon and fluorine containing etchant. A C/F ratio of the second carbon and fluorine containing etchant is lower than the C/F ratio of first carbon and fluorine containing etchant. Exemplarily, the second carbon and fluorine containing etchant can include materials selected from the group consisting of perfluoromethane and hexafluoroethan. Since an etching rate to TiN (that is the materials of the metal mask layer 110) of the second carbon and fluorine containing etchant, which possesses lower C/F ratio, is much lower than its etching rate to SiON and to the low-K material (that are materials of the dielectric mask layer 108 and the dielectric layer 106), the sixth etching process is performed to remove the dielectric mask layer 108 and the dielectric layer 106 not covered by the metal mask layer 110. Consequently, the first trench opening 122, the second trench opening 126, the first via opening 130 and the second via opening 134 are all transferred to the underneath dielectric layer 106 and thus a plurality of damascene openings 138 are formed.

Please refer to FIG. 14 again, when transferring the first trench opening 122, the second trench opening 126, the first via opening 130 and the second via opening 134 to the dielectric layer 106 during the sixth etching process, the base layer 104 can be simultaneously removed. In another way, the base layer 104 can be removed by another suitable etchant after the sixth etching process. Thus the conductive layer 102 is exposed in the bottoms of the damascene openings 138. Furthermore, after forming the damascene openings 138, a barrier layer (not shown), a seed layer (not shown) and a conductive layer (not shown) filling up the damascene openings 138 are sequentially formed in the damascene openings 138 and followed by performing a planarization process to remove the unnecessary conductive layer, seed layer, barrier layer, cap layer 112, metal mask layer 110 and dielectric mask layer 108. Thus, dual damascene structures are obtained. Since those steps are well-known to those skilled in the art, the details are omitted from the preferred embodiment in the interest of brevity.

In conclusion, as DPT is implemented in the present invention to form the trench openings and the via openings by respectively performing at least four patterning processes, the dielectric layer is totally covered by the dielectric mask layer to prevent the dielectric layer from being affected by the four patterning processes, for example, the dielectric layer may not absorb the etchants used in the patterning processes, so that the characteristics of the dielectric layer can be maintained. Additionally, in the present invention, after the trench openings and the via openings are sequentially formed in the mask layers, the trench openings and the via openings in the mask layers are simultaneously transferred to the dielectric layer to avoid the effect caused by etchants or the photoresist of the repeated patterning processes. Accordingly, precise patterns can be obtained, and the consistency of the dual damascene structure may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a dual damascene structure, comprising:

sequentially forming a dielectric layer, a dielectric mask layer and a metal mask layer on a substrate;

forming a plurality of trench openings in the metal mask layer, wherein a part of the metal mask layer is exposed in a bottom of each of the trench openings, and the dielectric mask layer is not exposed by the trench openings;

forming a plurality of via openings in the dielectric mask layer after forming the trench openings, wherein a part of the dielectric mask layer is exposed in a bottom of each of the via openings; and transferring the trench openings and the via openings to the dielectric layer to form a plurality of dual damascene openings.

2. The method of fabricating a dual damascene structure according to claim 1, wherein before transferring the trench openings and the via openings to the dielectric layer, the dielectric layer is not exposed by the trench openings and the via openings.

3. The method of fabricating a dual damascene structure according to claim 1, wherein at least a via opening is in one of the trench openings.

4. The method of fabricating a dual damascene structure according to claim 3, wherein a width of each of the trench openings is substantially the same as a width of each of the via openings.

5. The method of fabricating a dual damascene structure according to claim 1, wherein the dielectric mask layer comprises a single layered structure.

6. The method of fabricating a dual damascene structure according to claim 1, wherein the dielectric mask layer comprises a multi-layered structure made of at least an upper material layer and at least a lower material layer, the via openings are formed in the upper material layer, and the lower material layer is exposed in the bottoms of the via openings.

7. The method of fabricating a dual damascene structure according to claim 1, wherein a material of the dielectric mask layer comprises silicon oxynitride, silicon oxide or other proper dielectric materials.

8. The method of fabricating a dual damascene structure according to claim 1, wherein the metal mask layer comprises a single layered structure or a multi-layered structure made of at least two materials.

9. The method of fabricating a dual damascene structure according to claim 1, wherein the metal mask layer exposed in the bottom of each of the trench openings has a fixed thickness.

10. The method of fabricating a dual damascene structure according to claim 1, wherein a step of forming a plurality of trench openings comprises sequentially forming at least a first trench opening and at least a second trench opening in the metal mask layer.

11. The method of fabricating a dual damascene structure according to claim 10, wherein the method of forming the first trench opening and the second trench opening comprises:

forming a first patterned photoresist layer on the metal mask layer;

performing a first etching process to form the first trench opening in the metal mask layer;

removing the first patterned photoresist layer;

forming a second patterned photoresist layer on the metal mask layer;

performing a second etching process to form the second trench opening in the metal mask layer; and removing the second patterned photoresist layer.

12. The method of fabricating a dual damascene structure according to claim 1, wherein a step of forming a plurality of trench openings comprises:

forming a cap layer on the metal mask layer;

sequentially forming at least a first opening and at least a second opening in the cap layer; and transferring the first opening and the second opening to the metal mask layer to simultaneously form at least a first trench opening and at least a second trench opening.

13. The method of fabricating a dual damascene structure according to claim 1, wherein the dielectric mask layer exposed in the bottom of each of the via openings has a fixed thickness.

14. The method of fabricating a dual damascene structure according to claim 1, wherein a step of forming a plurality of via openings comprises sequentially forming at least a first via opening and at least a second via opening in the dielectric mask layer.

15. The method of fabricating a dual damascene structure according to claim 14, wherein the method of forming the first via opening and the second via opening comprises:

forming a third patterned photoresist layer on the dielectric mask layer;

performing a third etching process to form the first via opening in the dielectric mask layer;

removing the third patterned photoresist layer;

forming a fourth patterned photoresist layer on the dielectric mask layer;

performing a fourth etching process to form the second via opening in the dielectric mask layer; and removing the fourth patterned photoresist layer.

16. The method of fabricating a dual damascene structure according to claim 1, wherein a step of forming a plurality of via openings comprises:

partially removing the metal mask layer exposed in the bottom of each of the trench openings to form at least a third opening in the metal mask layer;

partially removing the metal mask layer exposed in the bottom of each of the trench openings to form at least a fourth opening in the metal mask layer; and transferring the third opening and the fourth opening to the dielectric mask layer to simultaneously form at least a first via opening and at least a second via opening.

17. The method of fabricating a dual damascene structure according to claim 1, wherein the substrate further comprises at least a conductive layer and a base layer, and the base layer covers the conductive layer.

18. The method of fabricating a dual damascene structure according to claim 17, wherein the conductive layer is exposed in bottoms of damascene openings.

* * * * *